US008561041B1

(12) United States Patent
Kuznicki et al.

(10) Patent No.: US 8,561,041 B1
(45) Date of Patent: Oct. 15, 2013

(54) PARALLEL EXECUTION OF FUNCTION CALLS IN A GRAPHICAL MODEL

(75) Inventors: Steve Kuznicki, Northville, MI (US); Chad Van Fleet, Salem, MI (US)

(73) Assignee: The MathWorks, Inc., Natick, MA (US)

( * ) Notice: Subject to any disclaimer, the term of this patent is extended or adjusted under 35 U.S.C. 154(b) by 594 days.

(21) Appl. No.: 12/723,253

(22) Filed: Mar. 12, 2010

Related U.S. Application Data

(60) Provisional application No. 61/219,172, filed on Jun. 22, 2009.

(51) Int. Cl.
*G06F 9/45* (2006.01)

(52) U.S. Cl.
USPC ........... 717/149; 717/151; 717/154; 717/156; 717/159

(58) Field of Classification Search
None
See application file for complete search history.

(56) References Cited

U.S. PATENT DOCUMENTS

| | | | | |
|---|---|---|---|---|
| 6,598,222 | B2 * | 7/2003 | Uchihira et al. | 717/154 |
| 7,010,787 | B2 * | 3/2006 | Sakai | 717/159 |
| 8,074,211 | B2 * | 12/2011 | Sakai | 717/156 |
| 8,127,283 | B2 * | 2/2012 | Sheynin et al. | 717/149 |
| 8,136,097 | B2 * | 3/2012 | Konishi et al. | 717/129 |
| 8,234,635 | B2 * | 7/2012 | Isshiki et al. | 717/149 |
| 2005/0144602 | A1 * | 6/2005 | Ngai et al. | 717/151 |
| 2007/0168985 | A1 * | 7/2007 | Konishi et al. | 717/124 |
| 2008/0127146 | A1 * | 5/2008 | Liao et al. | 717/150 |
| 2008/0229220 | A1 * | 9/2008 | Jing | 715/763 |
| 2009/0064115 | A1 * | 3/2009 | Sheynin et al. | 717/149 |
| 2010/0306753 | A1 * | 12/2010 | Yi et al. | 717/149 |

OTHER PUBLICATIONS

E.N. Houstis et al.; Ellpack:Anumericalsimulationprogramming Environmentforparallelmimdmachines; 1990 ACM; pp. 96-107; <http://dl.acm.org/citation.cfm?id=255144>.*
T. Delaitre et al.; A graphical toolset for simulation modelling of parallel systems; 1997 Elsevier Science B.V.; pp. 1823-1837; <http://www.sciencedirect.com/science/article/pii/S0167819196000798>.*
Daniel Pease et al.; PAWS: A Performance Evaluation Tool for Parallel Computing Systems; 1991 IEEE; pp. 18-36; <http://ieeexplore.ieee.org/stamp/stamp.jsp?tp=&arnumber=67190>.*
Sabri Pllana et al.; Performance Prophet: A Performance Modeling and Prediction Tool for Parallel and Distributed Programs; 2005 IEEE; 8 pages; <http://ieeexplore.ieee.org/stamp/stamp.jsp?tp=&arnumber=1488736>.*
Jim Larson; Erlang for Concurrent Programming; 2009 Erlang.org; pp. 48-56; <http://dl.acm.org/citation.cfm?id=1467247>.*
Simonetta Balsamo et al.; Model-Based Performance Prediction in Software Development: A Survey; 2004 IEEE; pp. 295-310; <http://ieeexplore.ieee.org/stamp/stamp.jsp?tp=&arnumber=1291833>.*

* cited by examiner

*Primary Examiner* — Thuy Dao
*Assistant Examiner* — Cuong V Luu
(74) *Attorney, Agent, or Firm* — Harrity & Harrity, LLP

(57) ABSTRACT

A method, tangible computer-readable medium and apparatus for concurrently executing subsystems in a graphical model is provided. An embodiment can transform a conventional graphical model supporting single threaded execution into a model supporting multi-threaded execution through the replacement of a single block. The transformed model may support concurrent execution of a plurality of subsystems using a plurality of threads when the graphical model executes. An embodiment provides a user interface that allows a user to intuitively configure a model for current execution of the subsystems.

20 Claims, 16 Drawing Sheets

PARALLEL EXECUTION OF FUNCTION CALLS IN A GRAPHICAL MODEL

RELATED APPLICATIONS

The instant application claims priority under 35 U.S.C. §119 to U.S. Provisional Patent Application Ser. No. 61/219,172, filed Jun. 22, 2009, the contents of which are incorporated by reference in their entirety.

BACKGROUND INFORMATION

Models may be used to simulate physical systems. For example, a graphical model may be used to represent a complex control system for a plant. The graphical model may include entities, such as blocks, that reference executable code for performing operations of the control system when the graphical model executes. The blocks can vary in type and/or number and may be connected together to build large, complex models (e.g., models including hundreds or more interconnected blocks).

Blocks can include function calls that perform an operation when the function of the block is executed. One way of representing function calls in a model is via function-call subsystem block. Function-call subsystem blocks may simplify a model by allowing multiple blocks and/or operations to be represented via a single block referred to as a function-call subsystem.

When a model includes more than one function-call subsystem, a technique may be required for executing the function-call subsystems in a determined order. Since graphical models support single threaded execution, a first function-call subsystem may need to execute on a main thread before a second function-call subsystem can execute. Conventional techniques may use a function-call generator block to inform function-call subsystems as to when to execute on the main thread to support serial execution of the model.

As models become large and/or complex, serial model execution on a single thread may not take advantage of available multi-processing capabilities and may produce undesirably long model execution times.

BRIEF DESCRIPTION OF THE DRAWINGS

The accompanying drawings, which are incorporated in and constitute a part of this specification, illustrate one or more embodiments of the invention and, together with the description, explain the invention. In the drawings.

DETAILED DESCRIPTION

Figure 1:
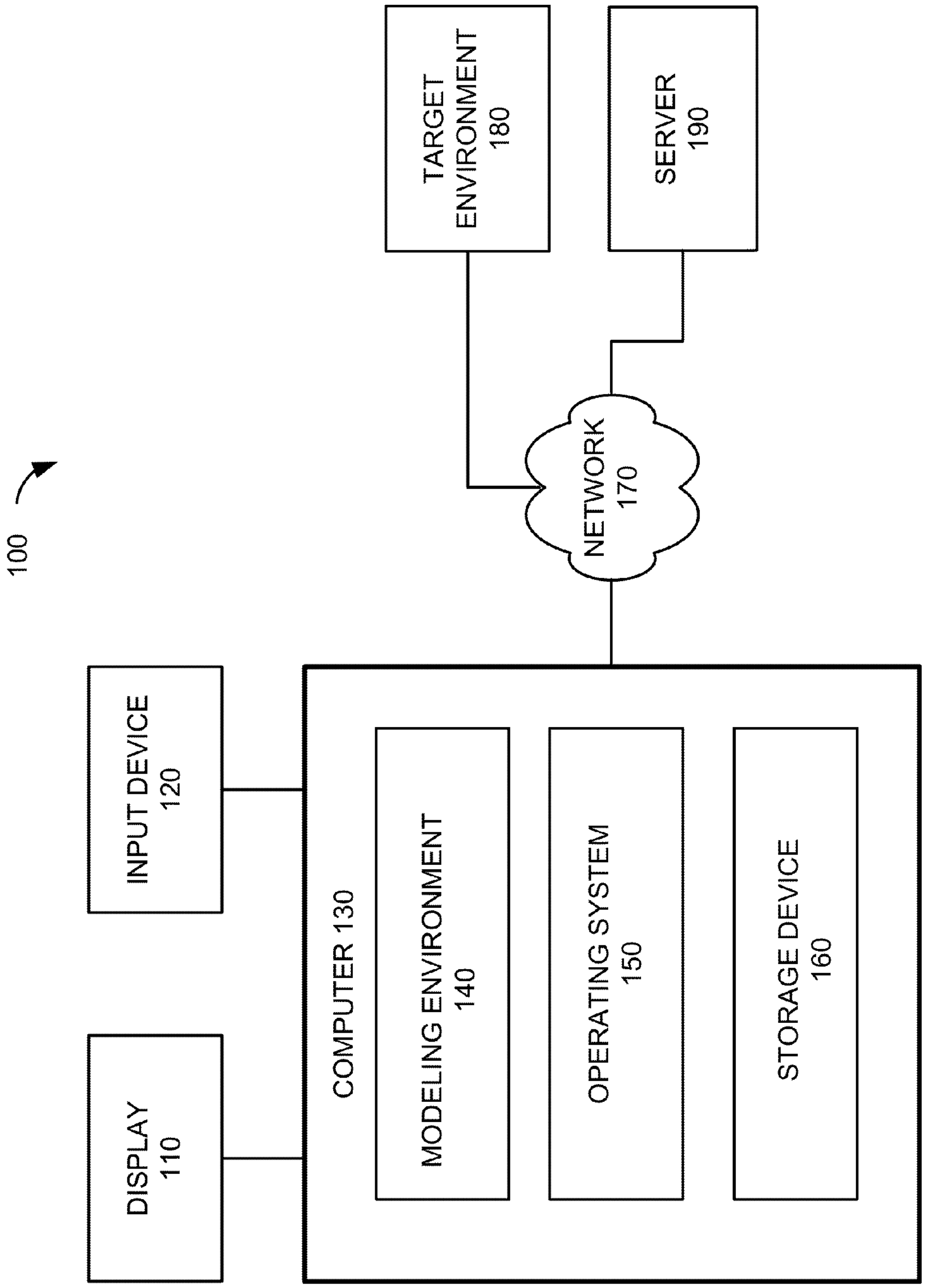
FIG. 1 illustrates an exemplary system for practicing an embodiment.

The following detailed description of implementations consistent with principles of the invention refers to the accompanying drawings. The same reference numbers in different drawings may identify the same or similar elements. Also, the following detailed description does not limit the invention. Instead, the scope of the invention is defined by the appended claims and their equivalents.

Overview

Users may create complex graphical models having hundreds or even thousands of components (e.g., blocks). In some instances, a user may employ function-call subsystems (FCS's) to group two or more components into a single graphical representation (e.g., a block) to simplify the model and to facilitate executing the model in a determined order. For example, using conventional techniques a user may place two FCS's into a model. The user may place a function-call generator block (FCGB) into the model and may connect the FCGB to the FCS's via function-call lines. The FCGB may execute one FCS and may execute the second FCS when the first FCS has executed. The conventional model may have to perform serial execution of the FCS's because the model and components in the model, such as the FCGB, may only support single threaded execution. FCGB's are used herein for illustrative purposes as a type of component that can be used to initiate a function call. Other implementations of the invention may use other techniques, such as but not limited to, state charts, hardware interrupt blocks (also referred to as asynchronous S-functions), etc., to initiate function calls consistent with the principles of the invention.

Exemplary embodiments provide a user with the ability to execute FCS's in parallel, or concurrently, when the FCS's do not have data dependencies between them. For example, a model may include a first FCS that performs a first operation and a second FCS that performs a second operation in the model. Moreover, the first FCS may not communicate with the second FCS, thus indicating no data dependency between the two FCS's. The embodiment may allow a user to replace a conventional FCGB with a concurrent function-call generator block (C-FCGB) that allows the model to execute the first FCS and the second FCS concurrently, i.e., at the same time, using two or more threads.

The C-FCGB includes logic that allows the user to configure the block to support concurrent execution using a plurality of threads. The user may indicate a number of processing devices on which to perform concurrent processing and may associate FCS's with the plurality of threads. Once processing devices and FCS's are identified, threads are spawned at model execution and are used to concurrently execute specified FCS's on the specified processing devices via the spawned threads.

Exemplary embodiments allow the user to perform simulations many times faster than with conventional models configured for serial execution. Exemplary embodiments may analyze FCS's to ensure that no data dependencies exist between FCS's identified for concurrent execution. Exemplary embodiments may further generate code for models configured for concurrent execution such that the generated code executes concurrently in a target environment.

Exemplary System

FIG. 1 illustrates an exemplary system 100 for practicing an embodiment. For example, system 100 may be used to construct models that include one or more entities (e.g., FCS's), to execute the models using a two or more threads, generate code from the models, and/or display model results to a user. System 100 may include display 110, input device 120, computer 130, network 170, target environment 180 and server 190. The system in FIG. 1 is illustrative and other embodiments of system 100 can include fewer devices, more devices, and/or devices in configurations that differ from the configuration of FIG. 1.

Display 110 may include a device that displays information to a user. Display 110 may include a cathode ray tube (CRT), plasma display device, light emitting diode (LED) display device, liquid crystal display (LCD) device, etc. Embodiments of display 110 may be configured to receive user inputs (e.g., via a touch sensitive screen) when desired. In an embodiment, display 110 can display one or more graphical user interfaces (GUIs) to a user. The GUIs may display a model, inputs for a model (e.g., user specified objectives, constraints, etc.), model outputs, and/or other types of information to a user.

Input device 120 may include logic to receive input from a user. For example, input device 120 may transform a user motion or action into a signal or message that can be interpreted by computer 130. Input device 120 can include, but is not limited to, keyboards, pointing devices, biometric devices, accelerometers, microphones, cameras, haptic devices, etc. In an embodiment, input device 120 may receive inputs from a user specifying objectives and constraints to be applied to a model, creating subsystems in the model, inserting a block to perform concurrent processing using the subsystems, etc. Display 110 may display results of the models to the user when the models execute.

Computer 130 may include a device that performs processing operations, display operations, communication operations, etc. For example, computer 130 may include logic, such as one or more processing or storage devices, that can be used to perform and/or support processing activities on behalf of a user. Embodiments of computer 130 may include a desktop computer, a laptop computer, a client, a server, a mainframe, a personal digital assistant (PDA), a web-enabled cellular telephone, a smart phone, smart sensor/actuator, or another computation or communication device that executes instructions to perform one or more activities and/or to generate one or more results.

Computer 130 may further perform communication operations by sending data to or receiving data from another device, such as server 190. Data may refer to any type of machine-readable information having substantially any format that may be adapted for use in one or more networks and/or with one or more devices. Data may include digital information or analog information. Data may further be packetized and/or non-packetized.

An embodiment of computer 130 may include modeling environment 140, operating system 150, and storage device 160. Modeling environment 140 may provide a computing environment that allows users to perform simulation or modeling tasks related to disciplines, such as, but not limited to, mathematics, science, engineering, medicine, business, etc. Modeling environment 140 may support one or more applications that execute instructions to allow a user to construct a model having executable semantics. In an embodiment, modeling environment 140 may execute the model to produce a result.

Models used with exemplary embodiments of the invention may include information in a textual or graphical form. For example, a model may be a graphical model that can be time-based model (e.g., differential equation models, difference equation models or discrete-time models with or without algebraic constraints, etc.), event-based model, state transition model, data flow model, component diagram, entity flow diagram, equation-based language diagram, etc.

Operating system 150 may manage hardware and/or software resources associated with computer 130. For example, operating system 150 may manage tasks associated with receiving user inputs, operating computer 130, allocating memory, prioritizing system requests, etc. In an embodiment, operating system 150 may be a virtual operating system. Embodiments of operating system 150 may include Linux, Mac OS, Microsoft Windows, Solaris, UNIX, etc. Operating system 150 may further run on a virtual machine, which can be provided by computer 130.

Storage device 160 may include a magnetic, solid state and/or optical recording medium and its corresponding drive, or another type of static storage device that may store static information and/or instructions for use by computer 130. Exemplary embodiments of storage device can include random access memory (RAM) or another type of dynamic storage device that may store information and instructions for execution by processing logic operating in computer 130. Storage device 160 may further include read only memory (ROM), and/or other types of static storage.

Network 170 may include any network capable of transferring data (e.g., packet data or non-packet data). Implementations of network 170 may include local area networks (LANs), metropolitan area networks (MANs) and/or wide area networks (WANs), such as the Internet, that may operate using substantially any network protocol, such as Internet protocol (IP), asynchronous transfer mode (ATM), synchronous optical network (SONET), user datagram protocol (UDP), IEEE 802.10, etc.

Network 170 may include network devices, such as routers, switches, firewalls, and/or servers (not shown). Network 170 may be a hardwired network using wired conductors and/or optical fibers and/or may be a wireless network using free-space optical, radio frequency (RF), and/or acoustic transmission paths. In an implementation, network 170 may be a substantially open public network, such as the Internet. In another implementation, network 170 may be a more restricted network, such as a corporate virtual network. Implementations of networks and/or devices operating on networks described herein are not limited to any particular data type, protocol, architecture/configuration, etc. For example, in an embodiment, network 170 may be a quantum network that uses quantum-compatible networking protocols.

Target environment 180 may include logic that executes instructions to perform one or more operations. In an embodiment, target environment 180 can include processing logic adapted to execute code generated from one or more models. In an embodiment, target environment 180 can include real-time logic for performing processing operations in real-time. For example, target environment 180 may include a real-time operating system and hardware that are configured to process received signals or events in real-time or to execute simulations in real-time.

Exemplary embodiment of target environment 180 can include field programmable gate arrays (FPGAs), application specific integrated circuits (ASICs), application specific instruction-set processors (ASIPs), digital signal processors (DSPs), graphics processor units (GPUs), programmable logic devices (PLDs), etc. Target environments 180 can further include a single processor that includes two or more types of logic, such as cores. Target environments 180 can be configured to support multi-threaded or multi-process applications using FPGAs, ASICs, ASIPs, DSPs, GPUs, PLDs, cores, etc.

Server 190 may include a device that receives data from, and sends data to, another device and/or network. For example, server 190 may include one or more server devices/computers (e.g., a workstation, mainframe, desktop computer, laptop computer, PDA, web enabled cellular telephone, smart phone, Wi-Fi device, smart sensor/actuator, or another type of device). Server 190 may be implemented as a standalone device, a distributed arrangement of devices (e.g., a cluster or pool of devices) arranged in substantially any type of configuration (e.g., star, ring, grid, etc.). Distributed implementations of server 190 may further include devices, such as load balancers, schedulers, network devices, etc., to allow distributed implementations of server 190 to operate in a determined manner.

In one implementation, server 190 may provide a service to other devices in system 100, such as computer 130. For example, server 190 may provide remote processing services to computer 130 via network 170.

Exemplary Modeling Environment

Figure 2:
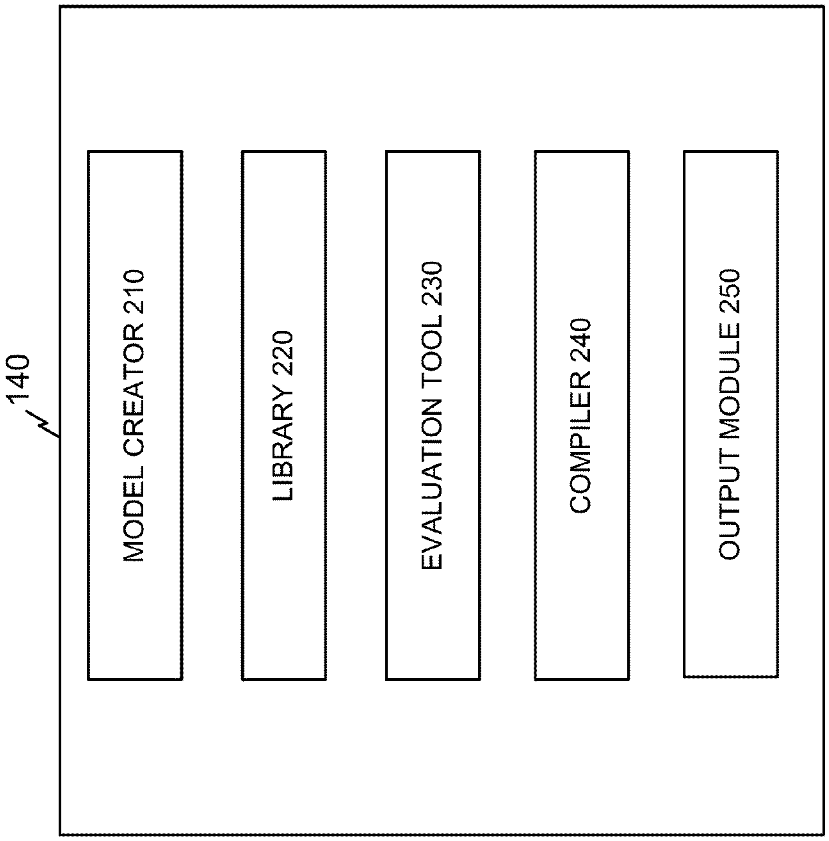
FIG. 2 illustrates an exemplary embodiment of the modeling environment of FIG. 1.

FIG. 2 illustrates an exemplary embodiment of a modeling environment 140. Modeling environment 140 can include model creator 210, library 220, evaluation tool 230, compiler 240, and output module 250. The embodiment of modeling environment 140 illustrated in FIG. 2 is illustrative and other embodiments of modeling environment 140 can include more entities or fewer components without departing from the spirit of the invention.

Model creator 210 may be an application for building a model. Model creator 210 can be used to build a graphical model having executable semantics. For example, model creator 210 may allow users to create, modify, diagnose, delete, etc., model entities and/or connections. For example, model creator 210 may display a canvas onto which a user can place blocks, connections (e.g., function-call lines, signal lines, etc.), etc., for creating a model of a dynamic system. Model creator 210 may interact with other entities illustrated in FIG. 1 or 2 for receiving user inputs, executing a model, displaying results, generating code, etc.

Library 220 may include code modules or entities, e.g., blocks/icons, and/or connections (e.g., lines) that a user can drag and drop onto a canvas that includes a model. In the case of graphical models, a user may further couple entities obtained from the library using connections to produce a graphical model of a system.

Evaluation tool 230 may evaluate a graphical model to determine whether data dependencies exit between subsystems in the model, such as FCS's. In an embodiment, evaluation tool 230 may include code for receiving user inputs specifying criteria for executing a model using concurrent processing techniques, such as multi-threaded execution. Evaluation tool 230 may further allow a user to identify components to be executed concurrently. Evaluation tool 230 may determine whether data dependencies exist between the identified components, and when they do an error may be provided to the user indicating that the components cannot be executed concurrently.

Compiler 240 may compile a model into an executable format. Compiled code produced by compiler 240 may be executed on computer 130 to produce a modeling result. In an embodiment, compiler 240 may also provide a user with debugging capabilities for diagnosing errors associated with the model and profiling capabilities for analyzing performance characteristics. Embodiments of compiler 240 may interact with evaluation tool 230 to, for example, allow evaluation tool 230 to store information related to compiler switch settings used to compile a model.

Output module 250 may include code for generating one or more outputs from a model when the model is executed. For example, output module 250 may display a model, a modeling result, and user interfaces for specifying processors used to concurrently execute the model. In an embodiment, output module 250 may create a graphical user interface (GUI) for displaying information to a user. Output module 250 may further produce other types of output from a model, such as generated code. In an embodiment, generated code can be configured for multi-threaded execution in target environment 180, which may be, for example, an embedded system.

Exemplary Model

Figure 3:
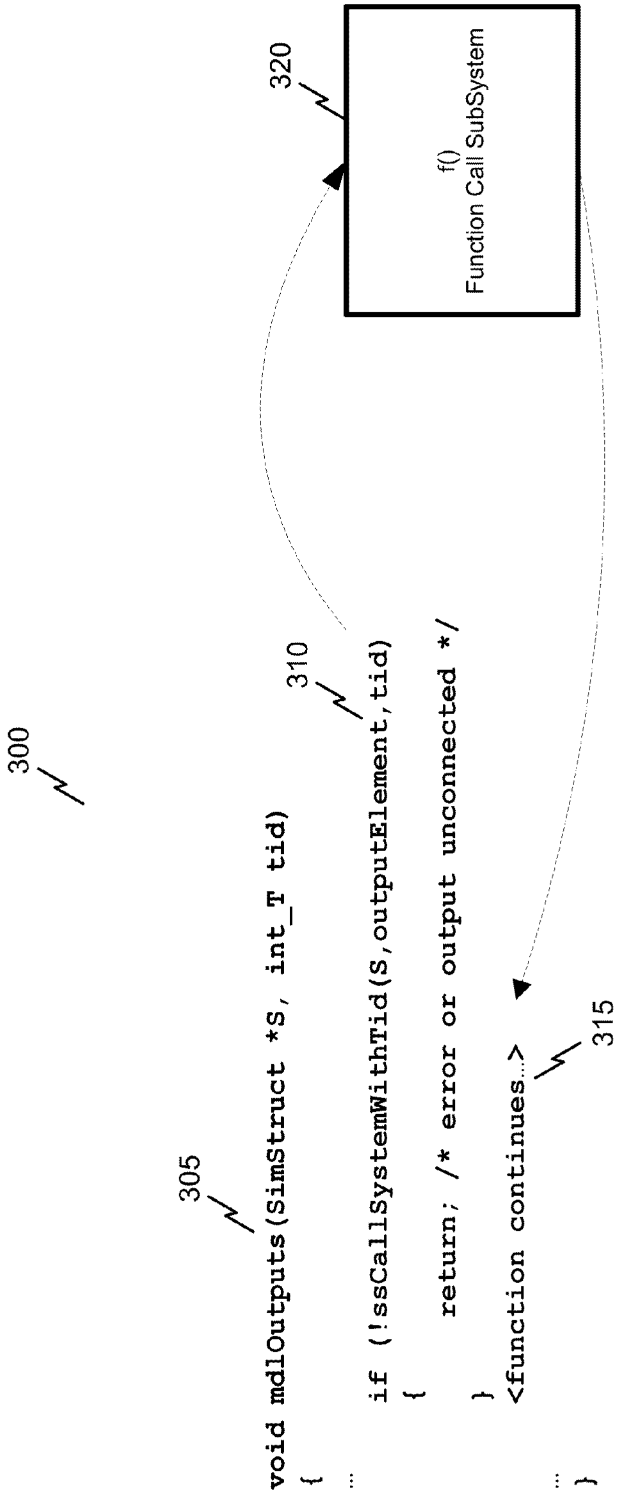
FIG. 3 illustrates a prior art technique for implementing a conventional function-call subsystem in a model.

FIG. 3 illustrates a prior art technique for implementing a conventional function-call subsystem in a model. In arrangement 300, program code 305 may include a call to an FCS 310. When call 310 is encountered, instructions associated with FCS 320 may be executed and may produce a result. When instructions associated with FCS 320 have executed, control may be returned to program code 305 via instruction 315.

A user may implement one or more FCS's, such as FCS 320, in a graphical model to perform a simulation. For example, a user may build a model that includes three FCS's, which is illustrated in FIG. 4.

Figure 4:
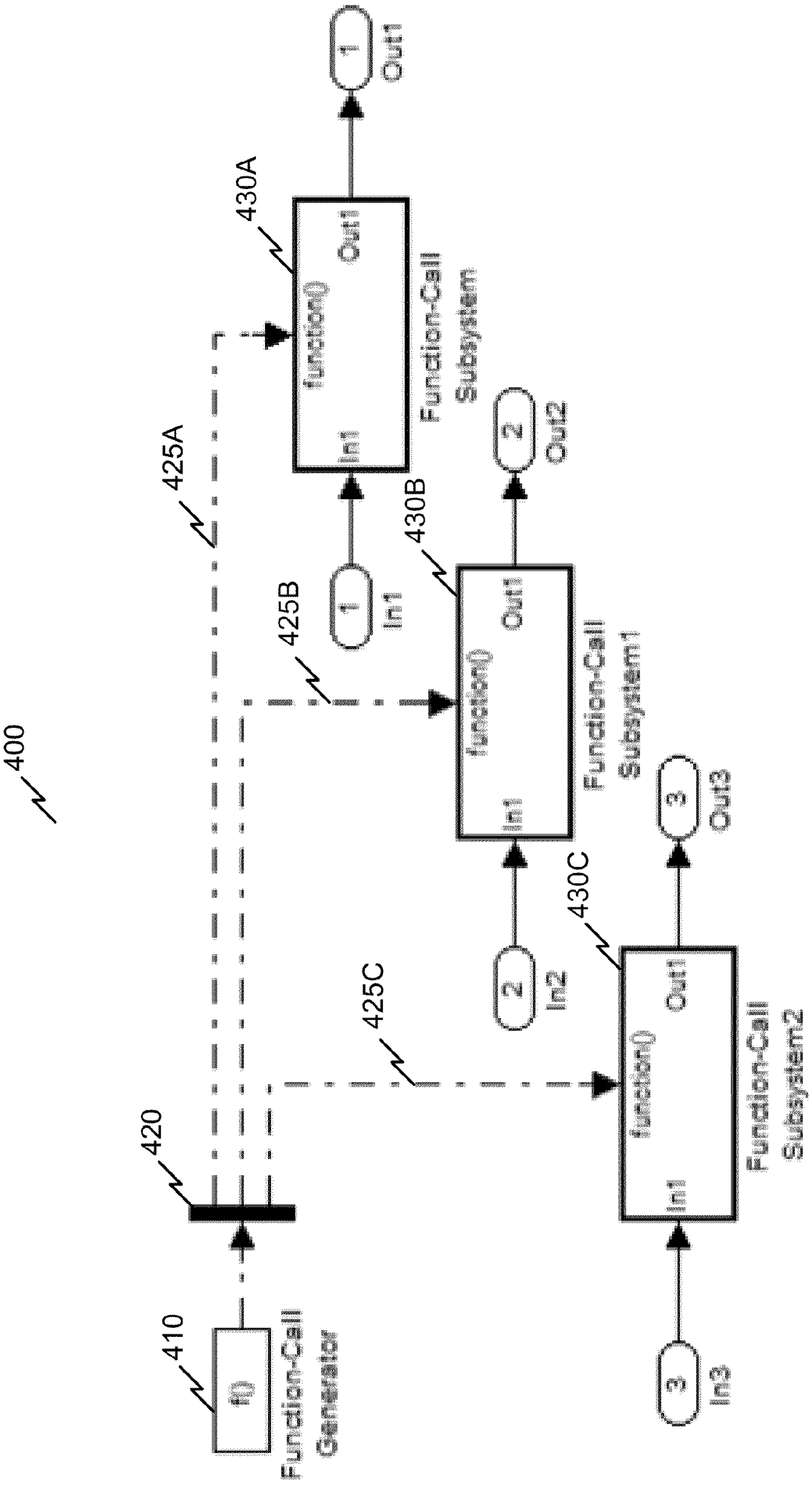
FIG. 4 illustrates a prior art technique for using a function-call generator and demultiplexer to support serial execution of function-call subsystems in a model.

FIG. 4 illustrates a prior art technique for using a FCG and demultiplexer to support serial execution of three FCS's in a model. For example, model 400 may include function-call generator (FCG) 410, demultiplexer (demux) 420, connections 425A, B and C, and FCS's 430A, B, and C. FCS's 430A, B, and C may be configured to perform certain operations when model 400 executes. When model 400 is executed, FCG 410 may interact with demux 420 to provide instructions to FCS's 430A, B, and C, respectively. The instructions may cause one of the FCS's to execute at a determined time. In the conventional model of FIG. 4, FCS's 430A, B and C execute serially, in that only one FCS can execute at a time. For example, a subsequent FCS can only execute when a currently executing FCS has finished executing.

Referring to FIG. 4, FCS's 430A, B, and C may be configured to execute in the following order: FCS 430A, then FCS 430B, and then FCS 430C. When FCG 410 sends an instruction to demux 420 to execute the first FCS, demux 420 sends an instruction to FCS 430A via function-call line 425A. FCS 430A executes in response to the instruction and produces a result. When FCS 430A has finished executing, FCG 410 can cause demux 420 to send an instruction to FCS 430B via function-call line 425B. FCS 430B may execute in response to the instruction and may produce a result. FCG 410 may then send an instruction to FCS 430C via demux 420 and function-call line 425C, and FCS 430C may execute in response to the instruction and may produce a result.

Exemplary Single Threaded Processing

Figure 5:
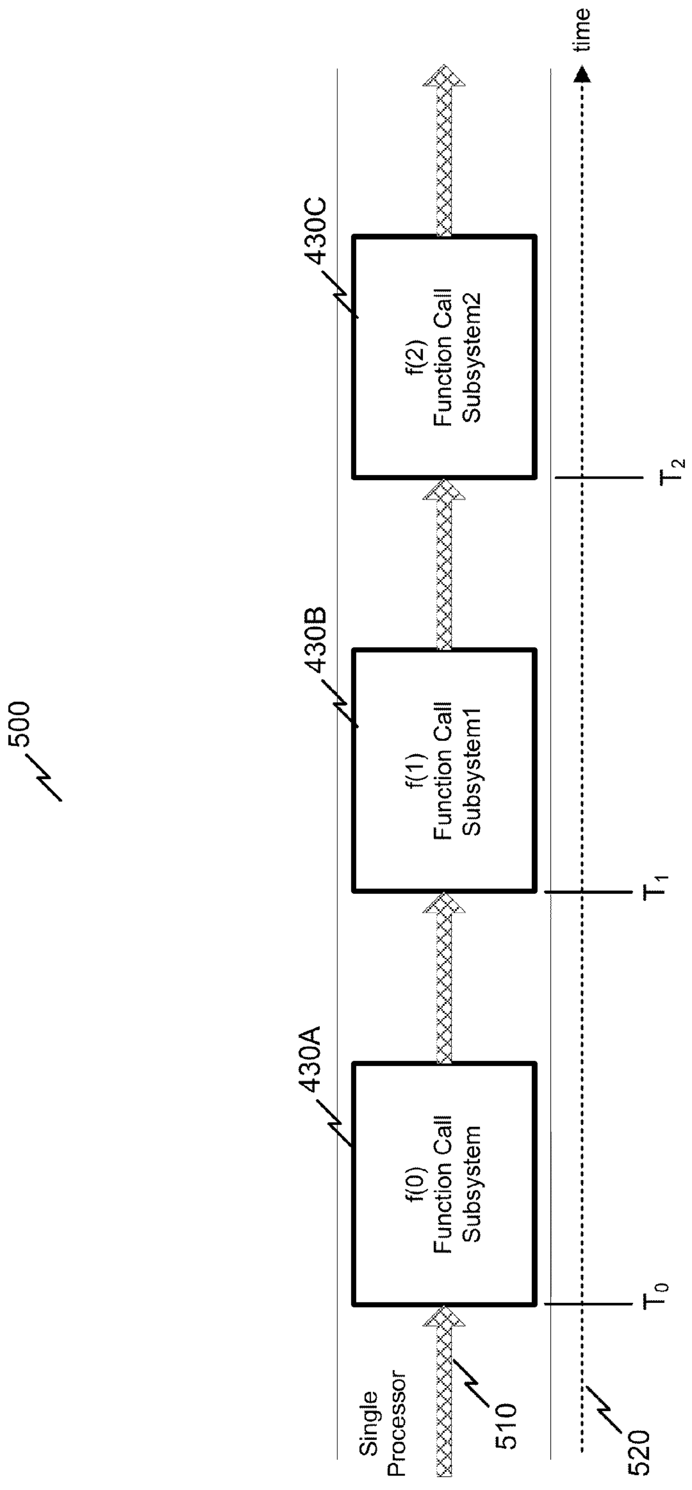
FIG. 5 illustrates the prior art technique of FIG. 4 with respect to a time axis.

FIG. 5 illustrates the serial processing of FIG. 4 along a time axis. A single processor may be provided in computer 130 and made available to model 400. The single processor may support a processing flow 510 (e.g., a single thread) with respect to time. In FIG. 5 time may be represented via time axis 520 with units of time (e.g., milliseconds) increasing toward the right margin of FIG. 5. FCG 410 may initiate FCS 430A first (e.g. at time $T_0$), and then may initiate FCS 430B at a later time (e.g., $T_1$) once FCS 430A has finished running (i.e., before $T_1$). FCG 410 may then initiate FCS 430C at a still later time (e.g., $T_2$) once FCS 430B has finished running. As seen from FIG. 5, conventional graphical modeling environments support a single processing flow, or thread, within a particular simulation.

Figure 6:
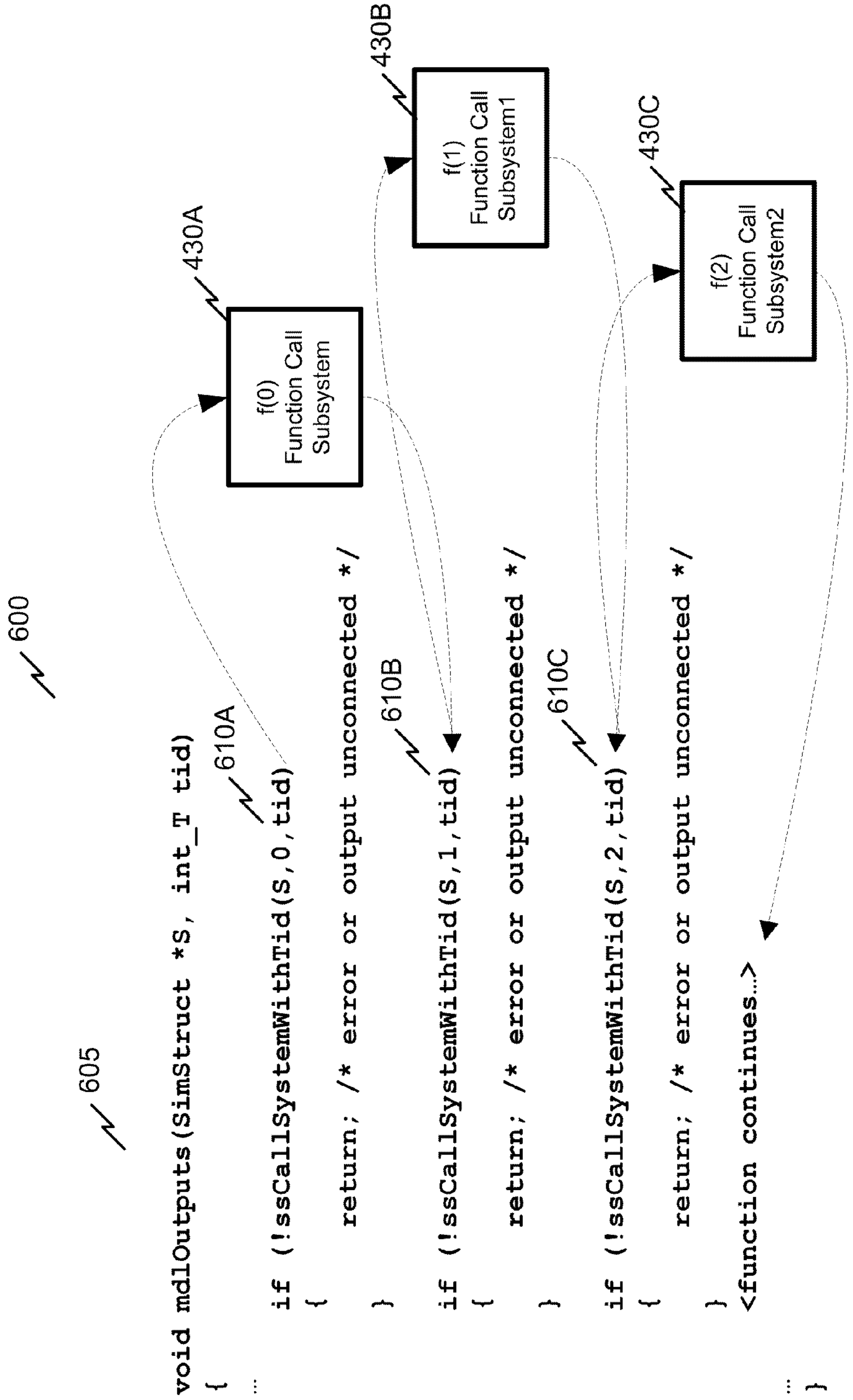
FIG. 6 illustrates schematically illustrates the prior art technique of FIG. 4 with respect to code calling the function-call subsystems in a serial fashion.

FIG. 6 schematically illustrates the prior art technique of FIG. 4 with respect to code calling FCS's in a serial fashion. Arrangement 600 may include program code 605 and FCS's 430A, B, and C. Code 605 may execute and may make a first call 610A to FCS 430A. When called, FCS 430A may execute and may produce a first result. After FCS 430A has executed, code 605 may make a second call 610B that may cause FCS 430B to execute and produce a second result. After FCS 430B has executed, code 605 may call FCS 430C, and FCS 430C may execute to produce a third result. When FCS 430C has finished executing other portions of code 605 may execute.

In FIG. 6, only one FCS at a time can execute. Subsequent FCS's (e.g., FCS 430B with respect to FCS 430A) cannot execute until the previous FCS has finished executing. Serial execution on a single thread, as supported by conventional processing techniques, may produce unacceptably long processing times for models that include two or more FCS's.

Exemplary Arrangement for Concurrent Processing

Figure 7:
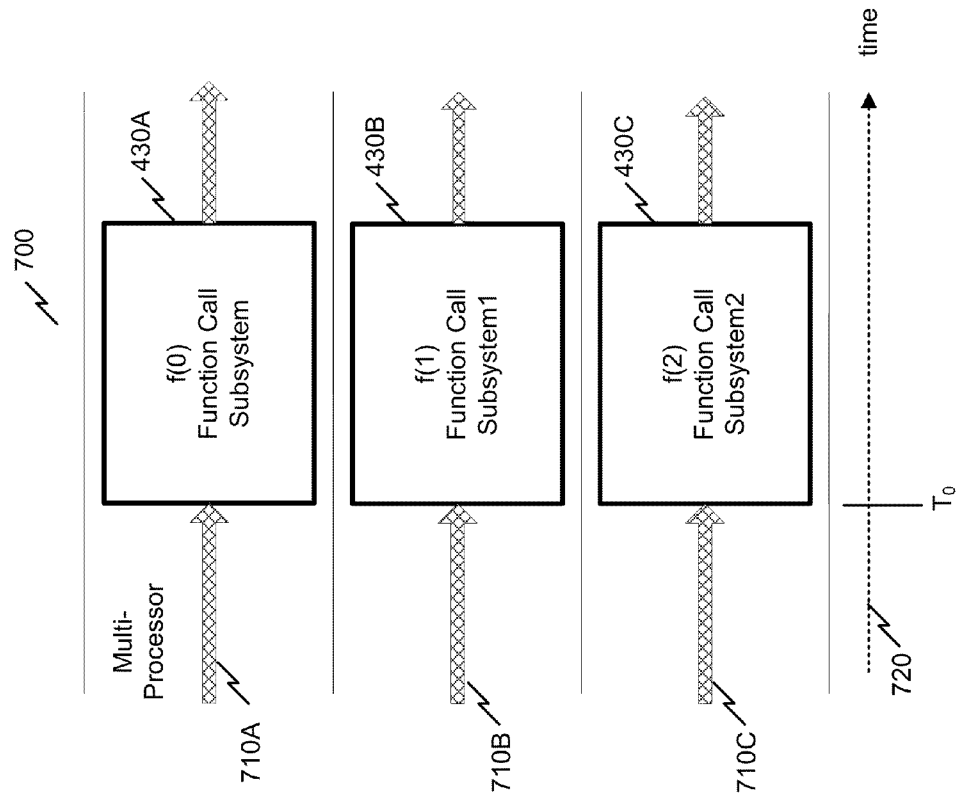
FIG. 7 illustrates an exemplary arrangement supporting concurrent (parallel) execution of function-call subsystems in accordance with an exemplary embodiment of the invention.

FIG. 7 illustrates an exemplary arrangement supporting concurrent (parallel) execution of FCS's in accordance with an exemplary embodiment of the invention. Arrangement 700 may include multi-processor threads 710A, B, and C and FCS's 430A, 430B, and 430C. Arrangement 700 may further include time axis 720 that can represent units of time that increase from left to right.

Referring to FIG. 7, thread 710A may be associated with a first piece of processing logic that can interpret and execute machine-readable instructions. Examples of processing logic can include but not limited to, a core on a processor, a processor in a group of processors, an FPGA, a GPU, a DSP, an ASIC, etc. Thread 710B may be associated with another core on the processor, as second processor in the group of processors, a second FPGA, GPU, DSP, ASIC, etc. And, thread 710C may be associated with still another piece of processing logic.

In FIG. 7, FCS 430A may execute on thread 710A, FCS 430B may execute on thread 710B, and FCS 430C may execute on thread 710C. In contrast to conventional single threaded implementations, the embodiment of FIG. 7 concurrently processes FCS's 430A, B, and C at the same time using threads 710A, B, and C, respectively. For example, all three FCS's begin executing at time $T_0$, with each FCS executing on a separate thread. FCS's 430A, B, and C may each produce a result at substantially the same time depending on the make up of the respective FCS's (e.g., number and/or type of components in a given FCS).

Embodiments employing the concurrent processing technique of FIG. 7 significantly shorten processing times for models that include multiple FCS's when the FCS's can be assigned to different threads.

Figure 8:
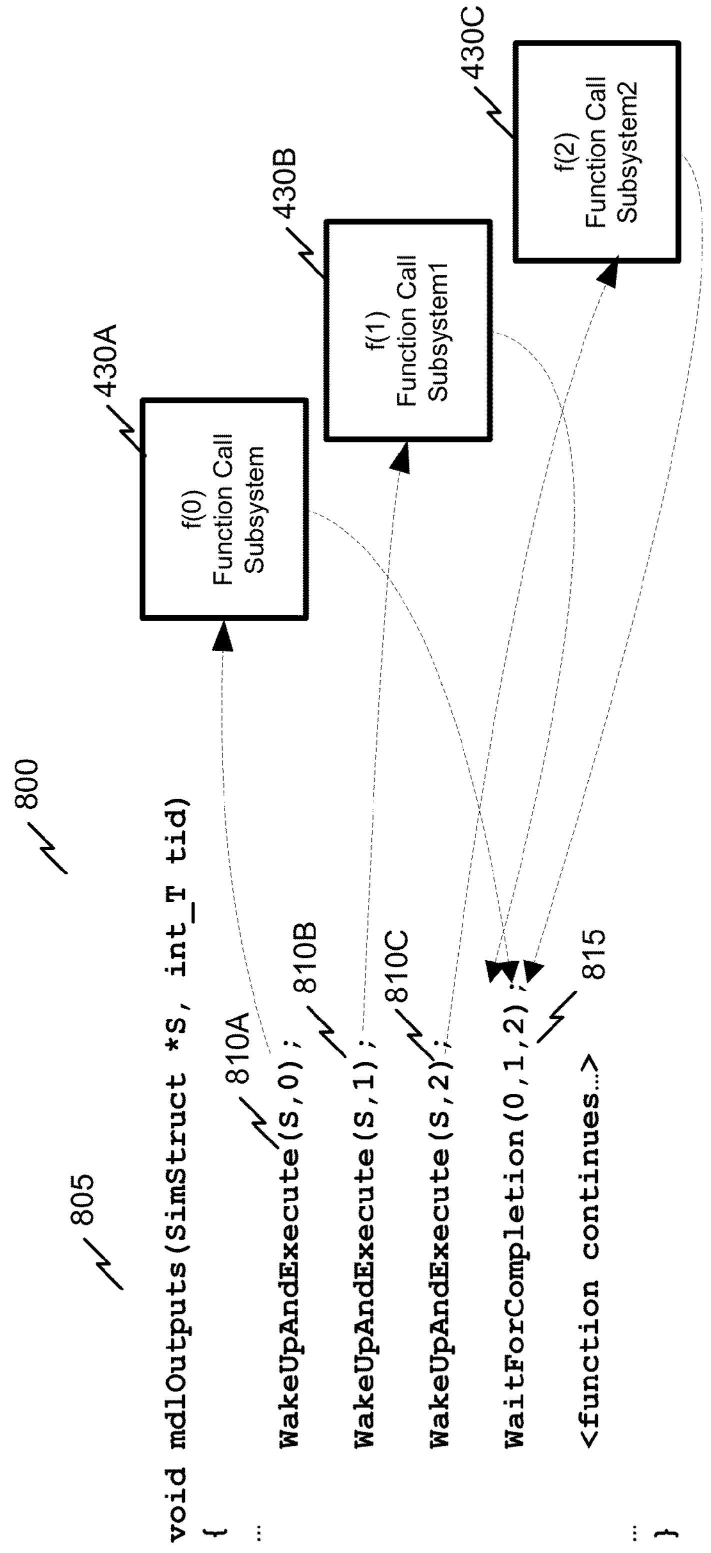
FIG. 8 illustrates an exemplary technique for supporting concurrent execution the function-call subsystems of FIG. 7.

FIG. 8 illustrates an exemplary technique for supporting concurrent execution of the FCS's of FIG. 7. Arrangement 800 can include program code 805 and FCS's 430A, B, and C. Code 805 may include a first call 810 that wakes up and executes FCS 430A. While FCS 430A is executing on a first thread, e.g., thread 710A, second call 810B may be encountered in code 805 and may wake up and execute FCS 430B. While FCS 430A and FCS 430B are executing, third call 810C may be encountered and may wake up and execute FCS 430C.

Arrangement 800 allows FCS 430A, B and C to execute concurrently. Code 805 may include command 815 that waits for FCS 430A, B, and C to finish executing before allowing other portions of code 805 to execute.

Exemplary embodiments may allow a user to take advantage of multi-threaded execution for allowing FCS's to concurrently execute in a model. In addition, embodiments may allow a user to concurrently execute FCS's using computer 130 without making significant modifications to an existing model. For example, in one embodiment, the user may replace a single block in a model to transform the model from single threaded execution to multi-threaded execution.

Exemplary Block for Concurrent Processing

Figure 9:
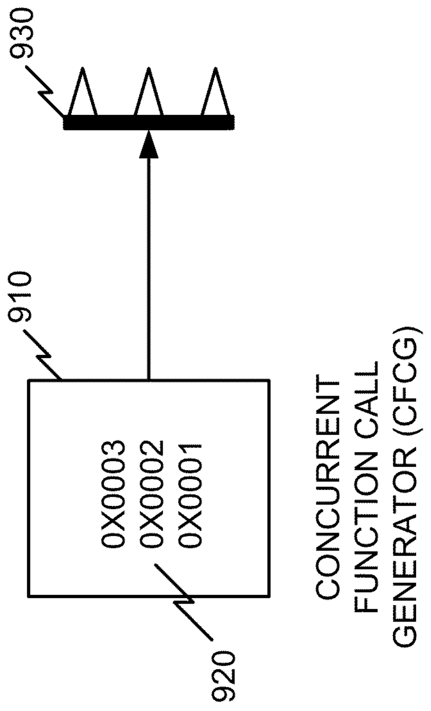
FIG. 9 illustrates an exemplary embodiment of a concurrent function-call generator block for use in concurrently executing a plurality of function-call subsystems in a graphical model.

FIG. 9 illustrates an exemplary embodiment of a concurrent function-call generator block for use in concurrently executing a plurality of FCS's in a graphical model. In an exemplary embodiment, a user can replace, for example, a conventional FCGB that supports single threaded execution with a concurrent function-call generator block (C-FCGB) that supports two or more concurrently operating threads.

Referring to FIG. 9, C-FCGB 910 may include a graphical representation displayable in a model, such as a block. Embodiments can include textual descriptions as to the type of block displayed in the model when desired. C-FCGB 910 may also include text, symbols, etc., for identifying processor affinities for use in performing concurrent processing of a model. For example, identifiers 920 may include bit masks that identify three pieces of processing logic, e.g., processors, for use in performing concurrent processing. The embodiment of FIG. 9 may further include demux 930 for receiving a signal from C-FCGB 910 and making the signal available to a determined one of FCS's in a model. Demux 930 may be a conventional demux that can be used with a conventional FCGB or with C-FCGB 910.

Exemplary Graphical User Interface

Figure 10A:
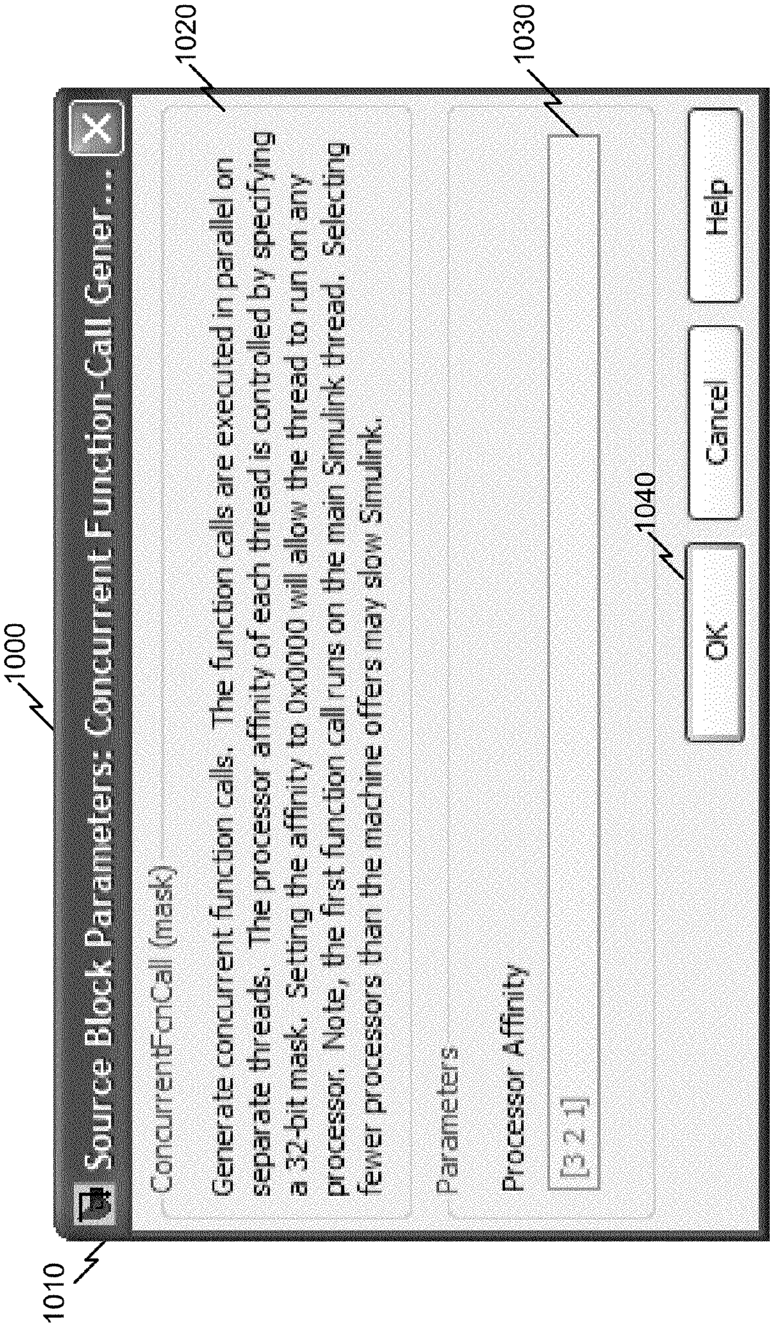
FIG. 10A illustrates an exemplary user interface for configuring a concurrent function-call generator blocks in accordance with an aspect of the invention.

FIG. 10A illustrates an exemplary user interface for configuring C-FCGB 910 in accordance with an aspect of the invention. FIG. 10A may include GUI 1000 for displaying information useful for configuring C-FCGB 910. GUI 1000 may include label 1010 for identifying the types of information input to GUI 1000 by a user. GUI 1000 may further include description 1020 that describes what information entered into GUI 1000 is used for, how the entered information is associated with types of processing logic, etc. GUI 1000 may further include parameter field 1030 for receiving parameters from a user. For example, a user may enter processor affinity information for C-FCGB 910 via parameter field 1030. In an embodiment, processor affinity information can include identifiers, such as textual (e.g., letters and/or numbers) and/or graphical identifiers that allow a user to associate processing logic with an FCS, a thread, etc. GUI 1000 may further include buttons 1040 for accepting user inputs, e.g., mouse clicks. Buttons 1040 can be used for accepting user inputs, canceling user inputs, accessing help menus, etc.

Figure 10B:
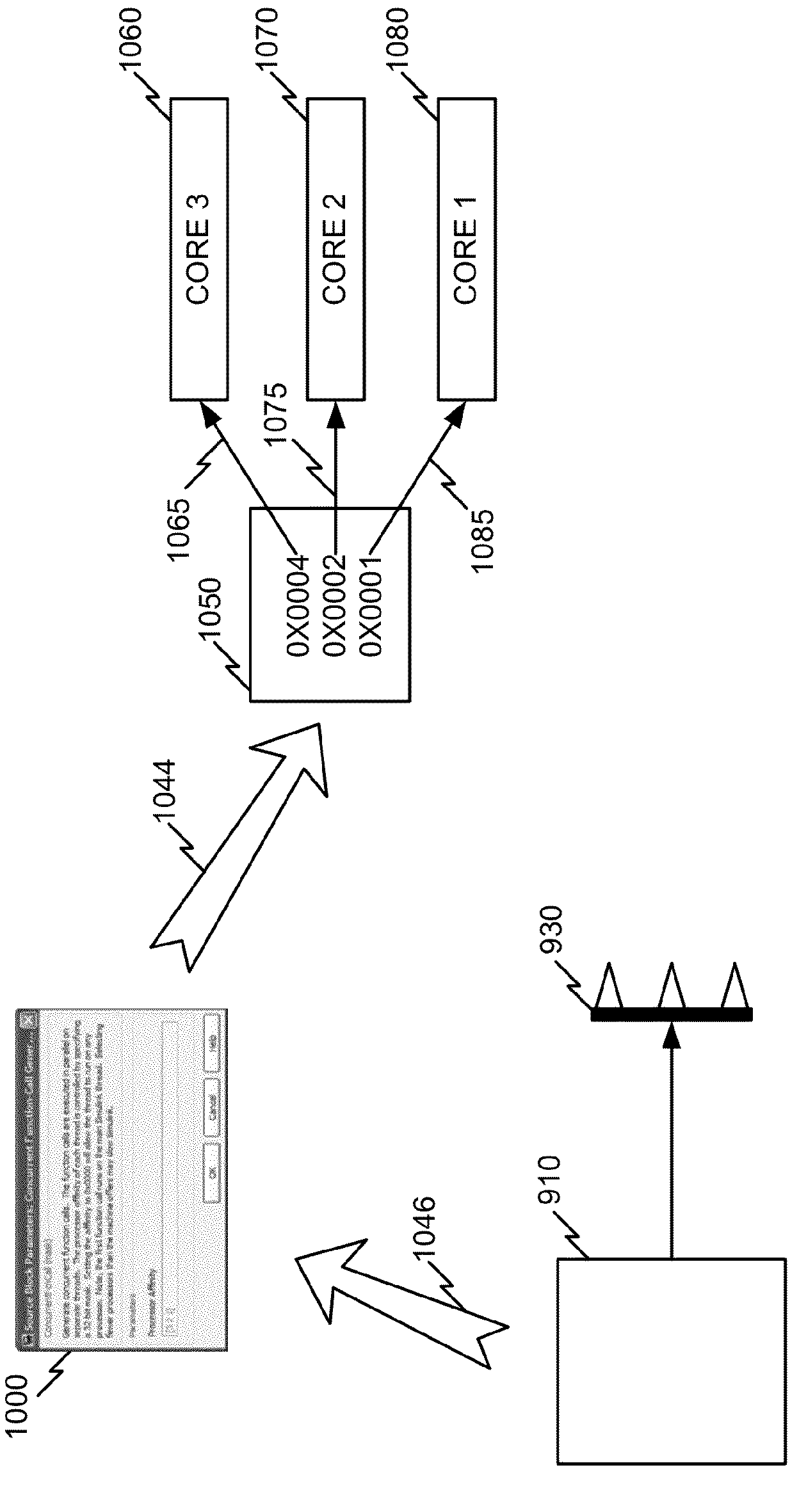
FIG. 10B illustrates an exemplary workflow for configuring an embodiment of the invention for concurrently processing a model that includes function-call subsystems.

FIG. 10B illustrates an exemplary workflow for configuring an embodiment of the invention for concurrently processing a model that includes FCS's. A user may interact with C-FCGB 910 using input device 120, such as a keyboard and/or mouse. For example, the user may double click over a graphical representation for C-FCGB 910 and may be presented with GUI 1000 (following workflow arrow 1046). GUI 100 may allow a user to configure a model for concurrently processing FCS's using a plurality of threads and/or processing devices. For example, the user may enter 3, 2 and 1 into GUI 1000 via parameter field 1030.

Information entered into parameter field 1030 may be stored in a data structure 1050 (following workflow arrow 1044). Information in data structure 1050 can be represented in a variety of formats that identify processing resources for performing concurrent processing of a model. For example, information in data structure 1050 can be stored as a bit mask, a universal resource locator (URL), an address, a name, etc. Referring to FIG. 10B, when bit masks are used to store information in data structure 1050, the stored information may indicate on which cores a thread is allowed to run. For example, 0x1 may indicate that a corresponding thread can run on a first core (e.g., core 1080 in FIG. 10B), bit mask 0x2 may indicate that a second thread can execute on a second core (e.g., core 1070 in FIG. 10B), and bit mask 0x3 may indicate that a third thread can execute on a third core (e.g., core 1060 in FIG. 10B). Threads in FIG. 10B may be associated with cores 1080 using link 1085, 1070 using link 1075, and with 1060 using link 1065.

Exemplary Model

Figure 11:
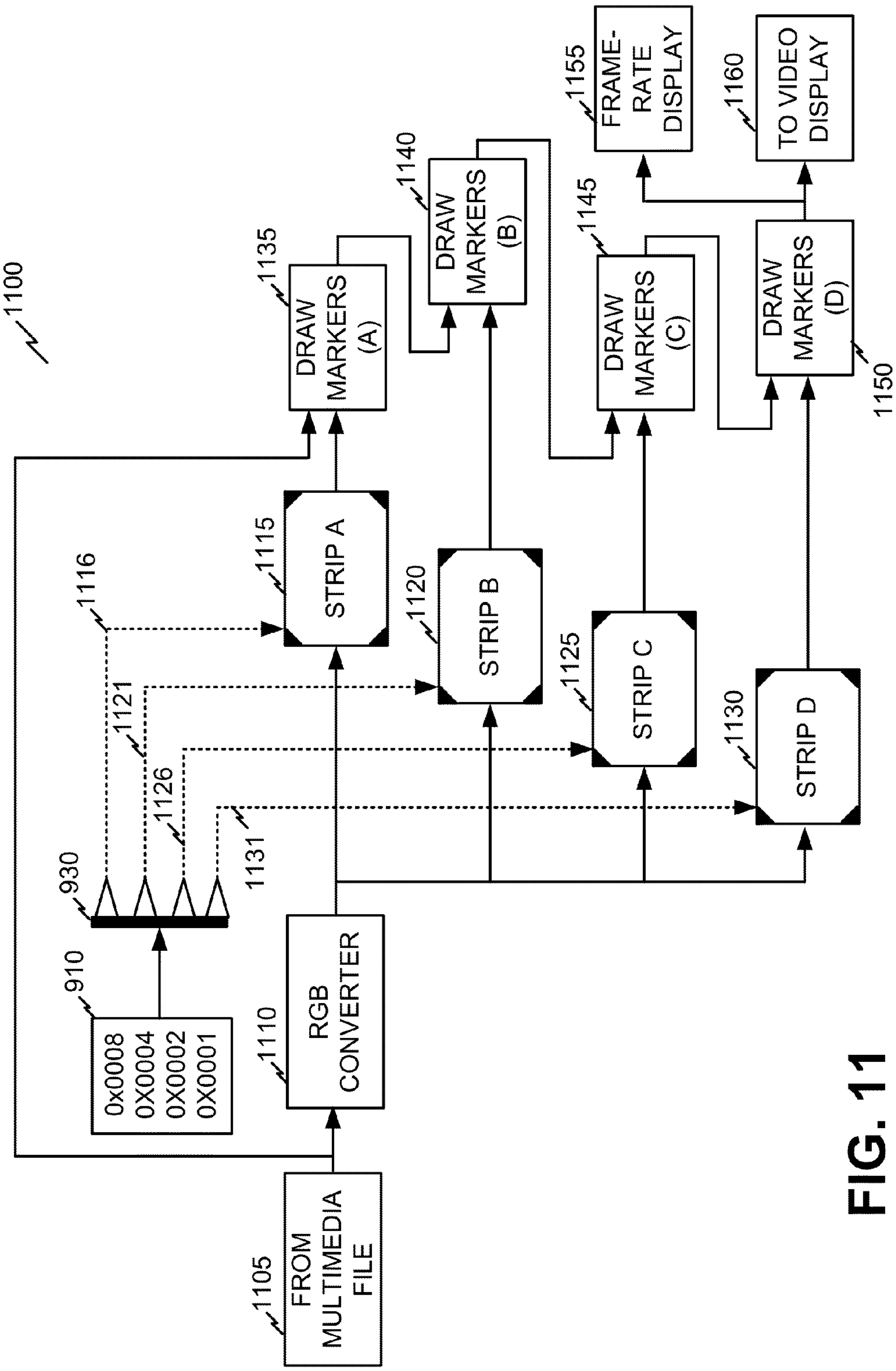
FIG. 11 illustrates an exemplary embodiment for concurrently processing image data.

FIG. 11 illustrates an exemplary embodiment for concurrently processing image data. Model 1100 may represent a system for processing image data using subsystems implemented as referenced models. A referenced model may be a model that is referenced by another model. For example block 1115 (strip A) may be a referenced model included in model 1100. Model 1100 may use the referenced model represented by block 1115 when model 1100 executes. In model 1100, referenced models 1115, 1120, 1125 and 1130 may not have data dependencies among the referenced models. For example, an image may include four strips of image data, where each strip can be processed independently using one of the referenced models.

A user of model 1100 may wish to use concurrent processing techniques to process image data passed through model 1100. The user may wish to use four cores to process data. Embodiments of the invention can make use of multiple cores on a single machine, such as computer 130, or cores that are distributed across multiple machines. The user may interact with GUI 1000 to configure C-FCGB 910 for concurrently using four cores. For example, the user may specify entries as displayed in FIG. 11 to indicate that one strip should be processed on each of the four cores. If desired, the user could further specify that a certain thread may run on core 1 and core 2, but not on core 3 if desired. Therefore, the embodiment of FIG. 11 is not limited to a particular way, or technique, for specifying processing logic on which to concurrently execute a plurality of threads associated with model 1100.

Model 1100 may receive image data from a multimedia file via block 1105. The received data may be provided to an RGB converter block 1110 to convert the received data into a format used by referenced models strip A 1115, strip B 1120, strip C 1125, and strip D 1130. When model 1100 is executed, C-FCGB 910 may send a signal to demux 930 that causes demux 930 to initiate strip A 1115 via signal 1116, strip B 1120 via signal 1121, strip C via signal 1126, strip D via signal 1131. C-FCGB 910 may further include mapping information that identifies particular processing logic on which each referenced model is to execute. For example, strip A 1115 may execute on a first core of a processor, strip B 1120 may execute on a second core of the processor, strip C 1125 may execute on a third core of the processor, and strip D 1130 may execute on a GPU residing on a computer hosting the processor.

When model 1100 executes, the referenced models may concurrently execute using the cores and GPU. Results of the respective referenced models may be further processed before a final result is displayed to a user. For example, marker drawing blocks 1135, 1140, 1145, and 1150 may be daisy chained together to process results from respective ones of the referenced models. An output of a final marker drawing block 1150 may be fed to a video display 1160 and to a frame rate display 1155.

Exemplary Processing

Figure 12:
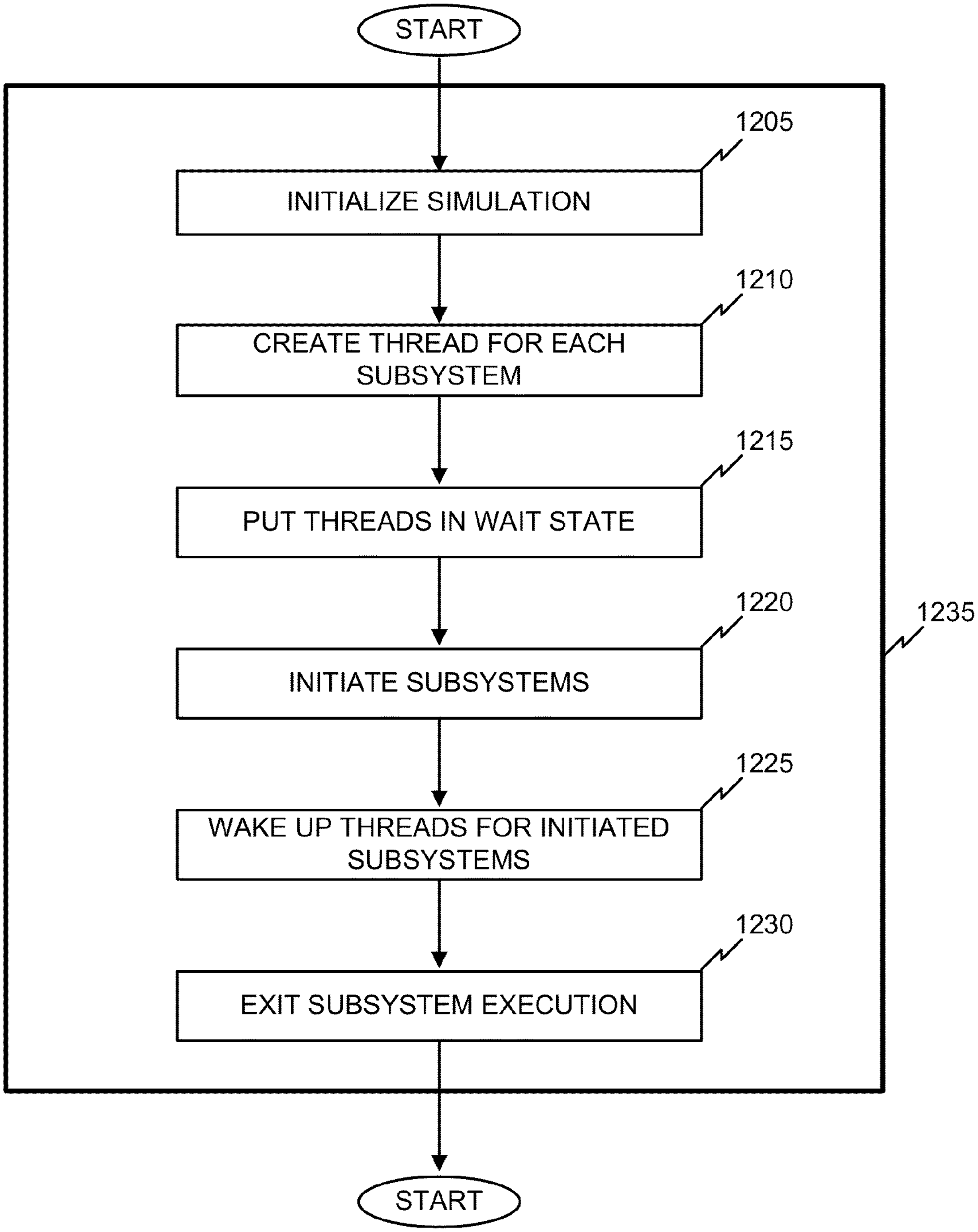
FIG. 12 illustrates an exemplary flowchart for performing processing consistent with an embodiment of the invention.

FIG. 12 illustrates an exemplary flowchart for performing processing consistent with an embodiment of the invention. A simulation may be initialized using computer 130. For example, model creator 210 may be used to create a graphical model that includes one or more subsystems that can be executed concurrently. The model may include C-FCGB 910 and demux 930 for providing signals that cause the subsystems to execute concurrently (act 1205). A user may initiate execution of the model and computer 130 may create a thread for each subsystem that will concurrently execute (act 1210).

Threads may be placed in wait states once they are created for the model (act 1215). A command may be initiated by C-FCGB 910 that causes subsystems in the model to begin executing concurrently (act 1220). Threads created for subsystems to be concurrently executed may be taken out of the wait state (act 1225). Subsystems in the model may concurrently execute using the available threads. When the subsystems have finished executing, subsystem execution may be exited (act 1230).

Figure 13:
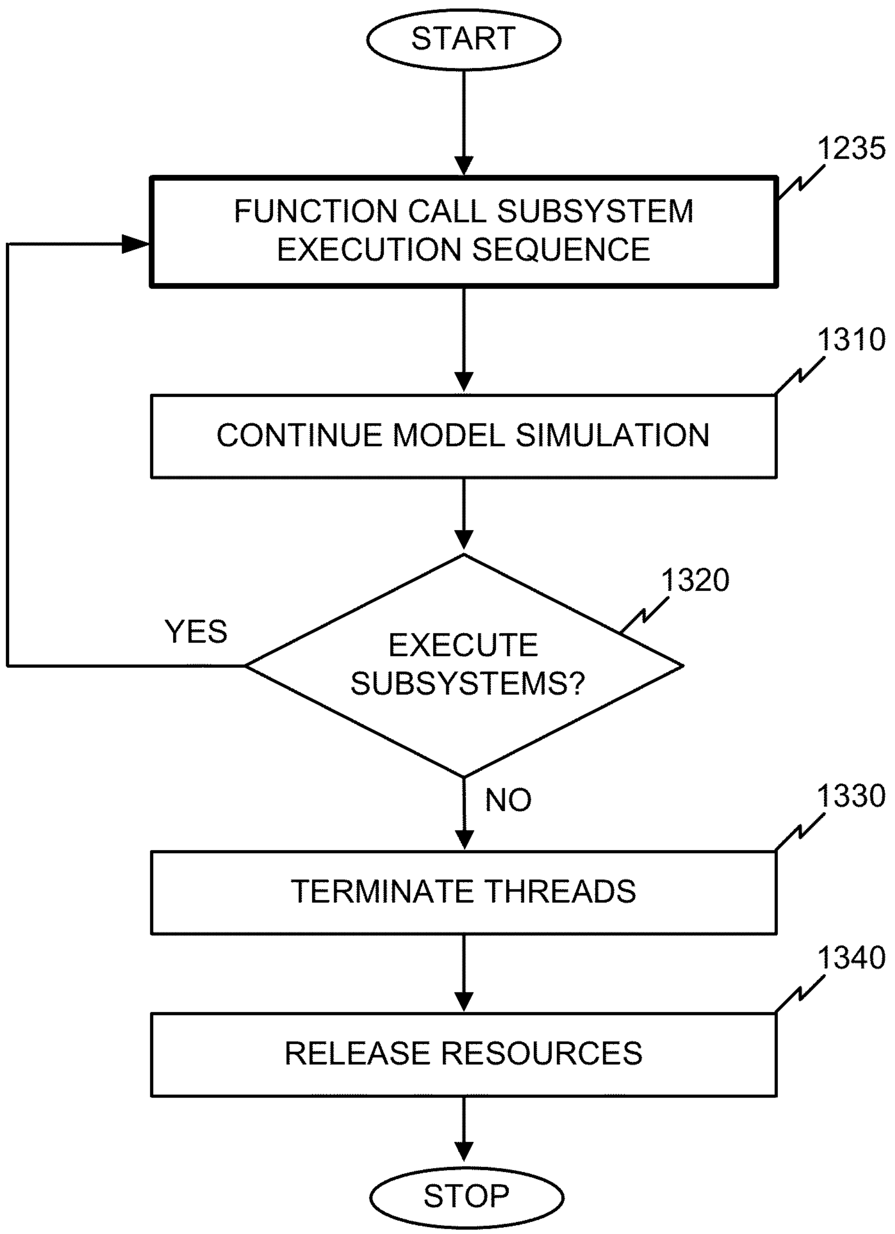
FIG. 13 illustrates exemplary processing for practicing an embodiment of the invention.

FIG. 13 illustrates exemplary processing for practicing an embodiment of the invention. The processing of FIG. 13 may leverage the processing of FIG. 12 when performing concurrent processing using subsystems in a graphical model. For example, when processing acts of FIG. 12 have finished (shown as act 1235 in FIG. 13), model simulation may continue using other blocks in the model (act 1310). During model execution, a determination may be made as to whether additional subsystems that were concurrently executed need to be executed again (act 1320). When the subsystems do not need to be executed again, threads created for the subsystems may be terminated (act 1330). Once the threads are terminated, resources associated with the threads, such as processing resources, memory resources, etc., may be released (act 1340).

In act 1320, when subsystems need to be executed, processing flow returns to act 1235, in which acts 1205-1230 may be executed as needed.

Exemplary Architecture

Figure 14:
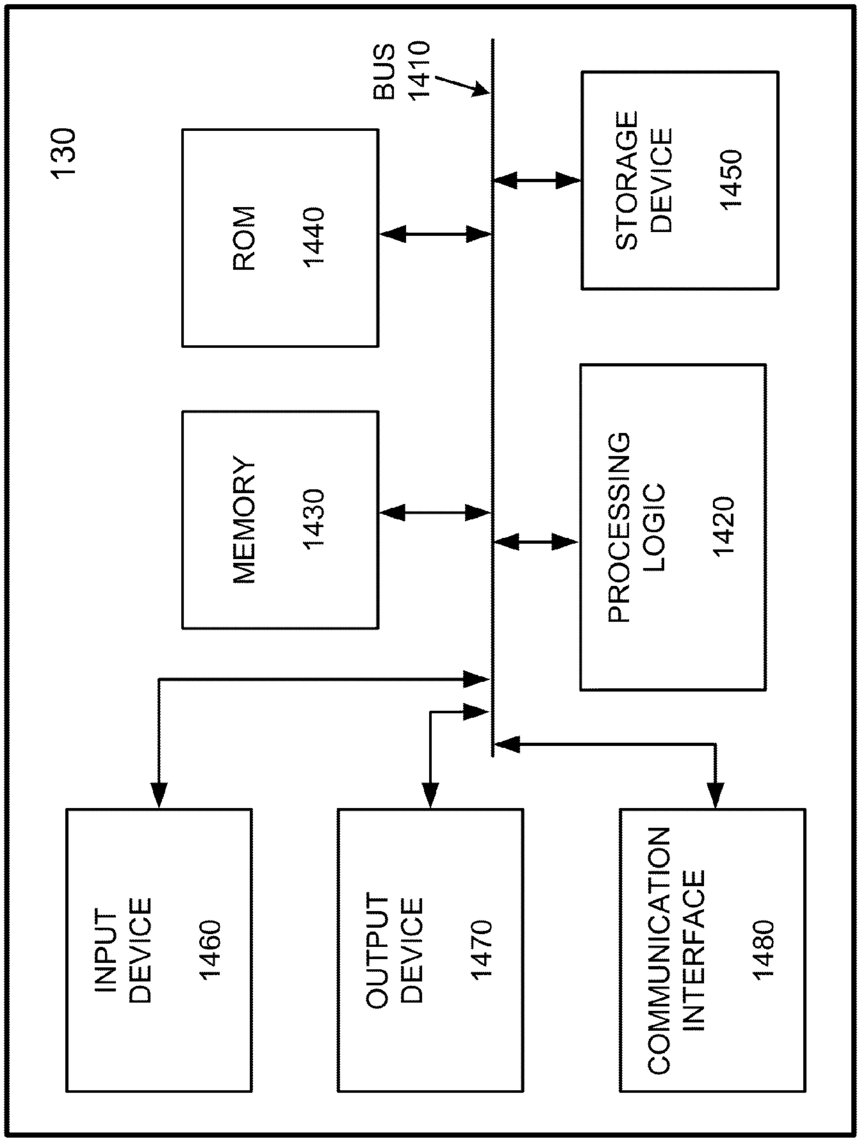
FIG. 14 illustrates an exemplary architecture for implementing the computer of FIG. 1.

FIG. 14 illustrates an exemplary computer architecture that can be used to implement computer 130 of FIG. 1. FIG. 14 is an exemplary diagram of an entity corresponding to computer 130. As illustrated, the entity may include a bus 1410, processing logic 1420, a main memory 1430, a read-only memory (ROM) 1440, a storage device 1450, an input device 1460, an output device 1470, and/or a communication interface 1480. Bus 1410 may include a path that permits communication among the components of the entity.

Processing logic 1420 may include a processor, microprocessor, or other types of processing logic (e.g., an FPGA), GPU, DSP, ASIC, etc.) that may interpret and execute instructions. For an implementation, processing logic 1420 may include a single core processor or a multi-core processor. In another implementation, processing logic 1420 may include a single processing device or a group of processing devices, such as a processing cluster or computing grid. In still another implementation, processing logic 1420 may include multiple processors that may be local or remote with respect each other, and may use one or more threads while processing.

Main memory 1430 may include a random access memory (RAM) or another type of dynamic storage device that may store information and instructions for execution by processing logic 1420. ROM 1440 may include a ROM device or another type of static storage device that may store static information and/or instructions for use by processing logic 1420. Storage device 1450 may include a magnetic, solid state and/or optical recording medium and its corresponding drive, or another type of static storage device that may store static information and/or instructions for use by processing logic 1420.

Input device 1460 may include logic that permits an operator to input information to the entity, such as a keyboard, a mouse, a pen, a touchpad, an accelerometer, a microphone, voice recognition, camera, neural interface, biometric mechanisms, etc. In an embodiment, input device 1460 may correspond to input device 120.

Output device 1470 may include a mechanism that outputs information to the operator, including a display, a printer, a speaker, a haptic interface, etc. In an embodiment, output device 1470 may correspond to display 110. Communication interface 1480 may include any transceiver-like logic that enables the entity to communicate with other devices and/or systems. For example, communication interface 1480 may include mechanisms for communicating with another device or system via a network.

The entity depicted in FIG. 14 may perform certain operations in response to processing logic 1420 executing software instructions stored in a tangible computer-readable storage medium, such as main memory 1430. A computer-readable storage medium may be defined as a physical or logical memory device. The software instructions may be read into main memory 1430 from another computer-readable storage medium, such as storage device 1450, or from another device via communication interface 1480. The software instructions contained in main memory 1430 may cause processing logic 1420 to perform techniques described herein when the software instructions are executed on processing logic. Alternatively, hardwired circuitry may be used in place of or in combination with software instructions to implement techniques described herein. Thus, implementations described herein are not limited to any specific combination of hardware circuitry and software.

Although FIG. 14 shows exemplary components of the entity, in other implementations, the entity may contain fewer, different, or additional components than depicted in FIG. 14. In still other implementations, one or more components of the entity may perform one or more tasks described as being performed by one or more other components of the entity.

Exemplary Distributed Embodiment

Distributed embodiments may perform processing using two or more processing resources. For example, embodiments can perform processing using two or more cores in a single processing device, distribute processing across multiple processing devices installed within a single enclosure, and/or distribute processing across multiple types of processing logic connected by a network.

Figure 15:
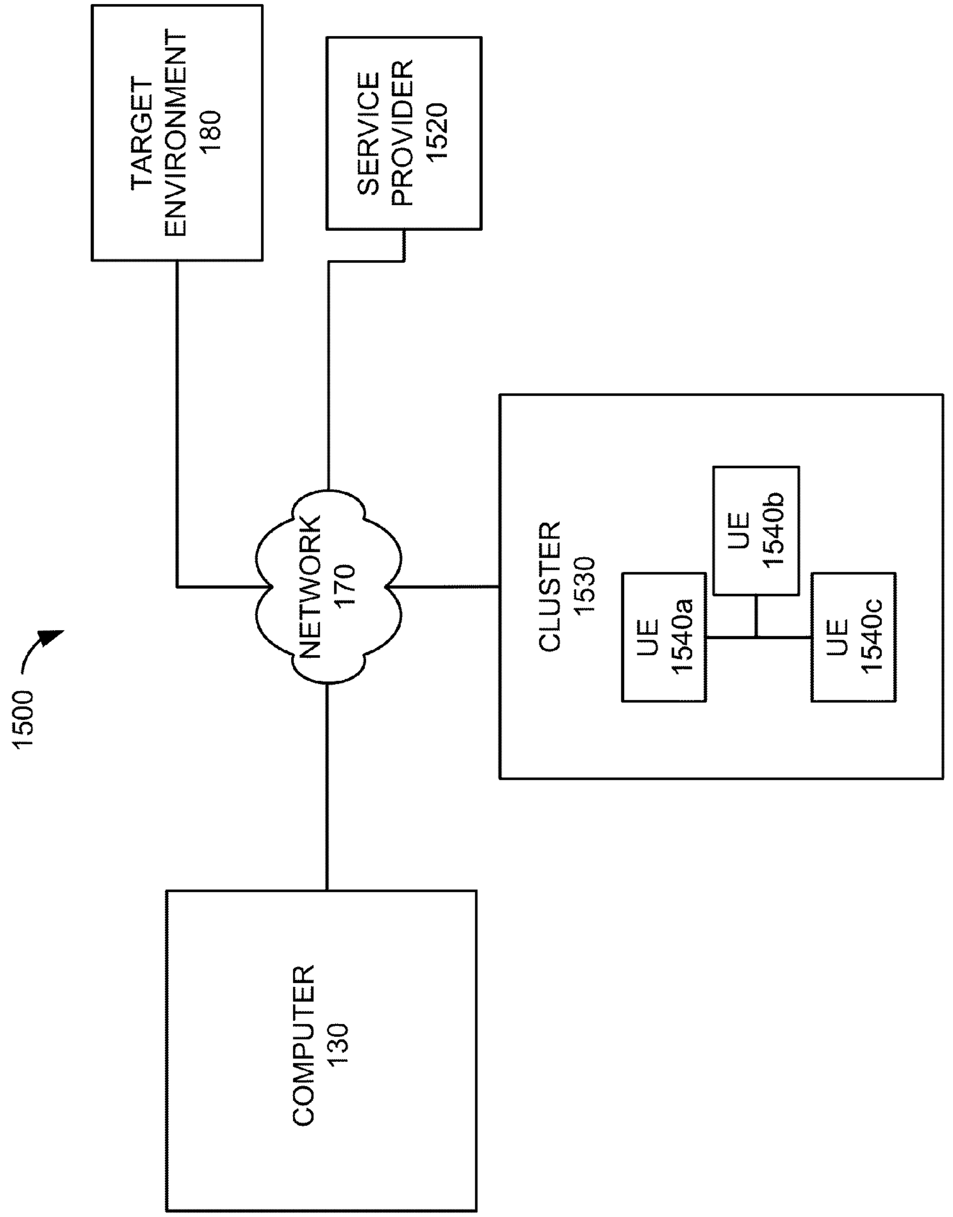
FIG. 15 illustrates an exemplary embodiment for implementing a distributed implementation of the invention.

FIG. 15 illustrates an exemplary system that can perform concurrent processing of graphical models using a plurality of threads. System 1500 may include computer 130, network 170, service provider 1520, and cluster 1530. The implementation of FIG. 15 is exemplary and other distributed implementations of the invention may include more devices and/or entities, fewer devices and/or entities, and/or devices/entities in configurations that differ from the exemplary configuration of FIG. 15.

Service provider 1520 may include a device that makes a service available to another device. For example, service provider 1520 may include an entity that provides one or more services to a destination using a server and/or other devices. Services may include instructions that are executed by a destination to perform an operation. Alternatively, a service may include instructions that are executed on behalf of a destination to perform an operation on the destination's behalf.

Assume, for sake of example, that a service provider operates a web server that provides one or more web-based services to a destination, such as computer 130. The web-based services may allow computer 130 to perform distributed simulations of electrical and/or mechanical systems using hardware that is operated by the service provider. For example, a user of computer 130 may be allowed to simulate models using two or more threads using the service provider's hardware. In an implementation, a customer (user) may receive services on a subscription basis. A subscription may include substantially any type of arrangement, such as monthly subscription, a per-use fee, a fee based on an amount of information exchanged between service provider 1520 and the customer, a fee based on a number of processor cycles used by the customer, a fee based on a number of processors used by the customer, etc.

Cluster 1530 may include a group of processing devices, such as units of execution 1540 that can be used to perform remote processing (e.g., distributed processing, parallel processing, etc.). Units of execution 1540 may include hardware and/or hardware/software based devices that perform processing operations on behalf of a requesting device, such as computer 130. In an embodiment, units of execution 1540 may each compute a partial result and the partial results can be combined into an overall result for a model.

Embodiments can perform activities described herein on graphical models executed in graphical modeling environments, such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from International Business Machines (IBM) Corporation; Ptolemy from the University of California at Berkeley; ASCET, CoWare, or aspects of a Unified Modeling Language (UML) or SysML environment. Graphical modeling environments can include block diagrams and/or other types of diagrams.

Embodiments may be implemented in a variety computing environments, such as environments that support statically or dynamically typed programming languages. For example, a dynamically typed language may be one used to express problems and/or solutions in mathematical notations familiar to those of skill in the relevant arts. For example, the dynamically typed language may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations. An exemplary embodiment that uses a dynamically typed language may be implemented in the Embedded MATLAB® programming language that can be used to create code for use in embedded applications.

CONCLUSION

Implementations may allow a user to transform a single threaded graphical model into a model supporting concurrent execution of subsystems using a plurality of threads.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, while a series of acts has been described with regard to FIGS. 12 and 13, the order of the acts may be modified in other implementations consistent with the principles of the invention. Further, non-dependent acts may be performed in parallel.

In addition, implementations consistent with principles of the invention can be implemented using devices and configurations other than those illustrated in the figures and described in the specification without departing from the spirit of the invention. For example, devices and/or entities may be added and/or removed from the implementations of FIG. 1, 2, 14, or 15 depending on specific deployments and/or applications. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. A method comprising:
accessing a graphical model,
the graphical model including:
a first subsystem block for implementing a first function when the graphical model executes,
a second subsystem block for implementing a second function when the graphical model executes, and
a concurrent control block for controlling concurrency in the graphical model,
the concurrent control block being different from the first subsystem block and the second subsystem block,
the concurrent control block including processor affinity information identifying information for concurrently processing the first subsystem block and the second subsystem block,
the concurrent control block including a plurality of explicit function-call lines coupling the concurrent control block to the first subsystem block and the second subsystem block, and
the accessing the graphical model being performed by a device;
creating, based on an initiation of an execution of the graphical model, a first thread for executing the first subsystem block and a second thread for executing the second subsystem block,
creating the first thread and the second thread being performed by the device;
executing the first subsystem block via the first thread to implement the first function during the execution of the graphical model,
executing the first subsystem block being performed by the device;
executing the second subsystem via the second thread to implement the second function while executing the first subsystem block via the first thread,
executing the second subsystem block being performed by the device; and
generating a result based on executing the first function on the first thread and executing the second function on the second thread,
generating the result being performed by the device.

2. The method of claim 1, where the concurrent control block includes a plurality of identifiers,
where the plurality of identifiers identify:
first processing logic for executing the first function on the first thread, and
second processing logic for executing the second function on the second thread.

3. The method of claim 2, where one or more of the first processing logic or the second processing logic are remote with respect to a device hosting the graphical model.

4. The method of claim 1, further comprising:

determining that no data dependencies exist between the first subsystem block and the second subsystem block; and determining to execute the first subsystem block and the second subsystem block based on determining that no data dependencies exist between the first subsystem block and the second subsystem block.

5. The method of claim 1, further comprising:

generating code for the graphical model.

6. The method of claim 1, further comprising:

receiving a selection of the concurrent control block included in the graphical model;

receiving, via a user interface, data for configuring the concurrent control block based on the selection; and creating the first thread and the second thread based on the data for configuring the concurrent control block.

7. One or more non-transitory computer-readable media storing instructions, the instructions comprising:

one or more instructions that, when executed by one or more processors, cause the one or more processors to:

determine that a graphical model includes:

a first subsystem block for performing a first operation, and a second subsystem block for performing a second operation, the second subsystem block being different from the first subsystem block;

identify a concurrent function-call generator (CFCG) block in the graphical model, the CFCG block being different from the first subsystem block and the second subsystem block, the CFCG block including processor affinity information identifying information for concurrently processing the first subsystem block and the second subsystem block;

create, based on identifying the CFCG block in the graphical model, a first thread for executing the first subsystem block and a second thread for executing the second subsystem block;

access the processor affinity information for the CFCG block, the processor affinity information indicating first processing logic for executing the first thread and second processing logic for executing the second thread;

use the first processing logic to execute, during an execution of the graphical model, the first subsystem block via the first thread to perform the first operation; and use the second processing logic to execute, during the execution of the first subsystem block, the second subsystem block via the second thread to perform the second operation concurrently with the first operation.

8. The one or more non-transitory computer-readable media of claim 7, where the CFCG block includes a plurality of identifiers, and where the plurality of identifiers are used to identify the first processing logic for executing the first subsystem block via the first thread and the second processing logic for executing the second subsystem block via the second thread.

9. The one or more non-transitory computer-readable media of claim 7, where the first processing logic is remote with respect to the second processing logic.

10. The one or more non-transitory computer-readable media of claim 7, where the graphical model includes a demultiplexer block that:

receives, during the execution of the graphical model, a signal from the CFCG block, and outputs, based on the signal from the CFCG block, a first function-call to cause the execution of the first subsystem block and a second function-call to cause the execution of the second subsystem block.

11. The one or more non-transitory computer-readable media of claim 7, where the instructions further comprise:

one or more instructions that cause the one or more processors to identify, in the graphical model, a function-call generator block for causing a serial execution of the first subsystem block and the second subsystem block;

one or more instructions that cause the one or more processors to determine whether data dependencies exist between the first subsystem block and the second system block; and one or more instructions that cause the one or more processors to replace, when no data dependencies exist between the first subsystem block and the second subsystem block, the function-call generator block with the CFCG block for causing a parallel execution of the first subsystem block and the second subsystem block.

12. The one or more non-transitory computer-readable media of claim 7, where the instructions further comprise:

one or more instructions that cause the one or more processors to determine that no data dependencies exist between the first subsystem block and the second subsystem block; and one or more instructions that cause the one or more processors to determine to concurrently execute the first subsystem block and the second subsystem block based on determining that no data dependencies exist between the first subsystem block and the second subsystem block.

13. The one or more non-transitory computer-readable media of claim 7, where the instructions further comprise:

one or more instructions that cause the one or more processors to generate code for the graphical model.

14. The one or more non-transitory computer-readable media of claim 7, where the instructions further comprise:

one or more instructions that cause the one or more processors to receive a selection of the CFCG block;

one or more instructions that cause the one or more processors to provide a user interface based on the selection; and one or more instructions that cause the one or more processors to receive, via the user interface, the processor affinity information for the CFCG block.

15. One or more non-transitory computer-readable media storing instructions, the instructions comprising:

one or more instructions that, when executed by at least one processor, cause the at least one processor to:

access a graphical model that includes:

a first subsystem block, a second subsystem block, and a subsystem calling block that controls a serial execution of the first subsystem block and the second subsystem block via a single thread;

determine that the first subsystem block does not communicate with the second subsystem block during an execution of the graphical model;

replace, based on the first subsystem not communicating with the second subsystem during the execution of the graphical model, the subsystem calling block with a concurrent subsystem calling block to control a parallel execution of the first subsystem block and the second subsystem block, the concurrent subsystem calling block being different from the first subsystem block and the second subsystem block, the concurrent subsystem calling block including:

a first identifier that identifies first processing logic for executing the first subsystem block via a first thread, and a second identifier that identifies second processing logic for executing the second subsystem block via a second thread while the first subsystem block executes on the first thread;

execute the graphical model, the one or more instructions that cause the at least one processor to execute the graphical model including:

one or more instructions that cause the at least one processor to create the first thread and the second thread based on an initiation of the execution of the graphical model, one or more instructions that cause the at least one processor to execute the first subsystem block on the first processing logic via the first thread based on the first identifier, one or more instructions that cause the at least one processor to execute, while the first subsystem block is executing on the first processing logic via the first thread, the second subsystem block on the second processing logic via the second thread based on the second identifier; and one or more instructions that cause the at least one processor to produce, during the execution of the graphical model, a result based on executing the second subsystem block on the second processing logic via the second thread while the first subsystem block is executing on the first processing logic via the first thread.

16. The one or more non-transitory computer-readable media of claim 15, where:

the graphical model comprises a first graphical model, the first subsystem block accesses a second graphical model to perform a first operation, the second subsystem block accesses a third graphical model to perform a second operation, and the first graphical model, the second graphical model, and the third graphical model comprise different graphical models.

17. The one or more non-transitory computer-readable media of claim 15, where the one or more instructions that cause the at least one processor to execute the graphical model include:

one or more instructions to execute the graphical model to process image data;

where the one or more instructions that cause the at least one processor to execute the first subsystem block include:

one or more instructions that cause the at least one processor to execute the first subsystem block on the first processing logic via the first thread to process a first portion of the image data;

where the one or more instructions that cause the at least one processor to execute the second subsystem block include:

one or more instructions that cause the at least one processor to execute, while the first subsystem block is executing on the first processing logic via the first thread, the second subsystem block on the second processing logic via the second thread to process a second portion of the image data; and where the one or more instructions that cause the at least one processor to produce the result include:

one or more instructions that cause the at least one processor to produce processed image data based on the processed first portion of the image data and the processed second portion of the image data.

18. The one or more non-transitory computer-readable media of claim 15, where the instructions further comprise:

one or more instructions that cause the at least one processor to determine that no data dependencies exist between the first subsystem block and the second subsystem block based on the first subsystem block not communicating with the second subsystem block during the execution of the graphical model; and where the one or more instructions that cause the at least one processor to replace the subsystem calling block with the concurrent subsystem calling block include:

one or more instructions that cause the at least one processor to replace the subsystem calling block with the concurrent subsystem calling block based on determining that no data dependencies exist between the first subsystem block and the second subsystem block.

19. The one or more non-transitory computer-readable media of claim 15, where the one or more instructions that cause the at least one processor to execute the graphical model further include:

one or more instructions that cause the at least one processor to create the first thread based on the first identifier, and one or more instructions that cause the at least one processor to create the second thread based on the second identifier.

20. The one or more non-transitory computer-readable media of claim 15, where one or more of the first processing logic or the second processing logic are remote with respect to a device hosting the graphical model.

* * * * *